(12) United States Patent
Allen et al.

(10) Patent No.: US 6,410,847 B1
(45) Date of Patent: Jun. 25, 2002

(54) PACKAGED ELECTRONIC SYSTEM HAVING SELECTIVELY PLATED MICROWAVE ABSORBING COVER

(75) Inventors: Barry R. Allen, Redondo Beach; Randy J. Duprey, Manhattan Beach, both of CA (US); Matthew D. Ferris, Chaska, MN (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/624,811

(22) Filed: Jul. 25, 2000

(51) Int. Cl.[7] ................................. H05K 9/00
(52) U.S. Cl. ................ 174/35 MS; 174/35 R; 361/816; 257/659; 257/724; 257/660
(58) Field of Search ............ 174/35 R, 35 MS, 174/52.4; 361/816, 818, 800; 257/659, 660, 724, 725

(56) References Cited

U.S. PATENT DOCUMENTS 5,371,404 A * 12/1994 Juskey et al. ............... 257/659
6,090,728 A * 7/2000 Yenni, Jr. et al. ........... 442/117

* cited by examiner

*Primary Examiner*—Dean A. Reichard
*Assistant Examiner*—Hung V Ngo

(57) ABSTRACT

A packaged electronic system is formed of a base having a surface and a plurality of discrete electronic components disposed on the base surface. An absorbing cover reduces the electromagnetic resonance produced by the discrete electronic components disposed within the packaged system. The entire cover is molded using a composite electromagnetic wave-absorbing plastic material. The cover is selectively plated to satisfy the shielding requirements of the packaged system.

7 Claims, 7 Drawing Sheets

PACKAGED ELECTRONIC SYSTEM HAVING SELECTIVELY PLATED MICROWAVE ABSORBING COVER

BACKGROUND OF THE INVENTION

1. Field of the Invention

The present invention relates generally to packaged electronic systems and, more specifically to such a system that includes an absorbing cover which reduces the electromagnetic resonance produced by the circuitry of the packaged microwave components.

2. Description of the Prior Art

The circuitry contained in packaged electronic systems is a source of electromagnetic resonance that may adversely affect the performance of the active circuitry contained therein by generating electromagnetic interference (EMI) or radio frequency interference (RFI).

Traditional microwave packages are metal, with a cover grounded to a housing or base. The package covers typically comprise many channels and cavities and, by attaching the package cover to the package base, the closed cavities or channels of the cover provide structural isolation of the electronic fields produced by a particular circuit housed within the package. It is generally known that there can be electromagnetic resonance within these cavities and channels, especially if the circuits are operating at very high frequencies. A number of techniques are described in the prior art that attempt to reduce the resonance effect on the circuitry contained within a microwave package.

As illustrated in FIGS. 1a and 1b, the prior art discloses a technique where electromagnetic interference is reduced by producing a sheet of absorber material (i.e. iron-loaded or ferrite material) and manually adhering the absorber material 11 to the ceiling of the cavities 13 contained on the underside 15 of the package cover 17. Although this technique has produced desirable results in the reduction of electromagnetic interference, the technique requires precise shaping and placement of the absorber material resulting in a complex and manually labor intensive fabrication process.

The technique disclosed in U.S. Pat. No. 5,397,854 attempts to minimize the complexity of the fabrication steps required by the method disclosed above. The '854 patent describes using an ink which contains a combination of a resin and a microwave absorbing material, such as iron or ferrite and screen printing or mask printing the ink onto the ceilings of the cavities and channels of the package cover. Although the '854 patent eliminates having to manually align and adhere the sheets of absorber in the cavities and channels of the cover, the method disclosed in the '854 patent introduces a different set of complexities. For example, a mask or a screen is required where the pattern of the mask or screen must precisely match the pattern of cavities and channels of the cover, the mask or screen must be accurately aligned with the cover prior to the printing process and following the printing process the ink must be hardened through a curing or drying process.

As previously discussed, present packaged electronic systems use a variety of techniques to reduce the electromagnetic interference caused by the emissions of active circuitry. However, these techniques require complicated fabrication processes, and are not cost effective. The greater the complexity, the more assembly costs are increased and reliability decreased.

Based on techniques known in the art for packaged microwave systems, a method for reducing electromagnetic interference of packaged microwave systems while reducing the cost of manufacturing electromagnetic wave absorbing covers is highly desirable.

SUMMARY OF THE INVENTION

It is an aspect of the present invention to provide a packaged electronic system that includes a base having a surface and a plurality of discrete electronic components disposed on the base surface. The present invention also includes a cover disposed on the base surface, wherein the cover has a molded body, an exterior surface, and an interior surface. The cover body may be selectively plated and is formed of a material having electromagnetic wave-absorbing characteristics.

BRIEF DESCRIPTION OF THE DRAWINGS

Reference is now made to the following specification and attached drawings, wherein.

DETAILED DESCRIPTION OF THE INVENTION

The present invention discloses a packaged microwave system that reduces the interference from electromagnetic emissions within the package and minimizes the manufacturing complexity and cost of the packaged system. Specifically, the present invention discloses a packaged microwave system where a cover is injection molded using a microwave absorbing thermoplastic material. The ability to injection mold the cover using microwave absorbing thermoplastic material has several advantages. First, the molding process eliminates the complex machining steps required for conventional metal covers. Second, injection molding, rather than machining, offers more flexibility in the design of various parts, and also reduces piece part prices. Further, by providing microwave-absorbing characteristics within the molded body of the RF cover the step of manually installing microwave-absorbing materials is eliminated. Finally, special adhesives are not needed to secure the microwave absorbing materials. Therefore, those of ordinary skill in the art should understand that the principles of the present invention are applicable to many types of packaged electronic systems.

Figure 1A:
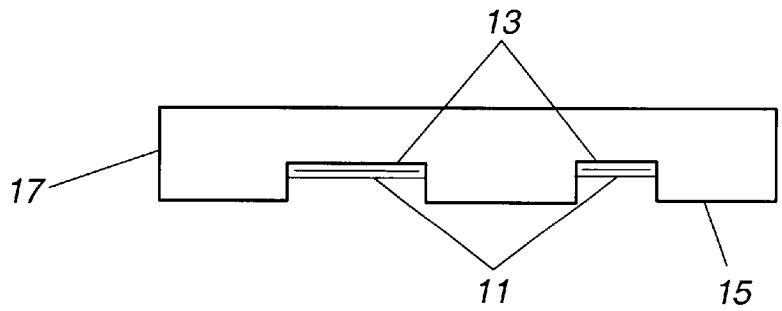
FIG. 1a is a cross section view illustration of a prior art electronic package cover.
Figure 1B:
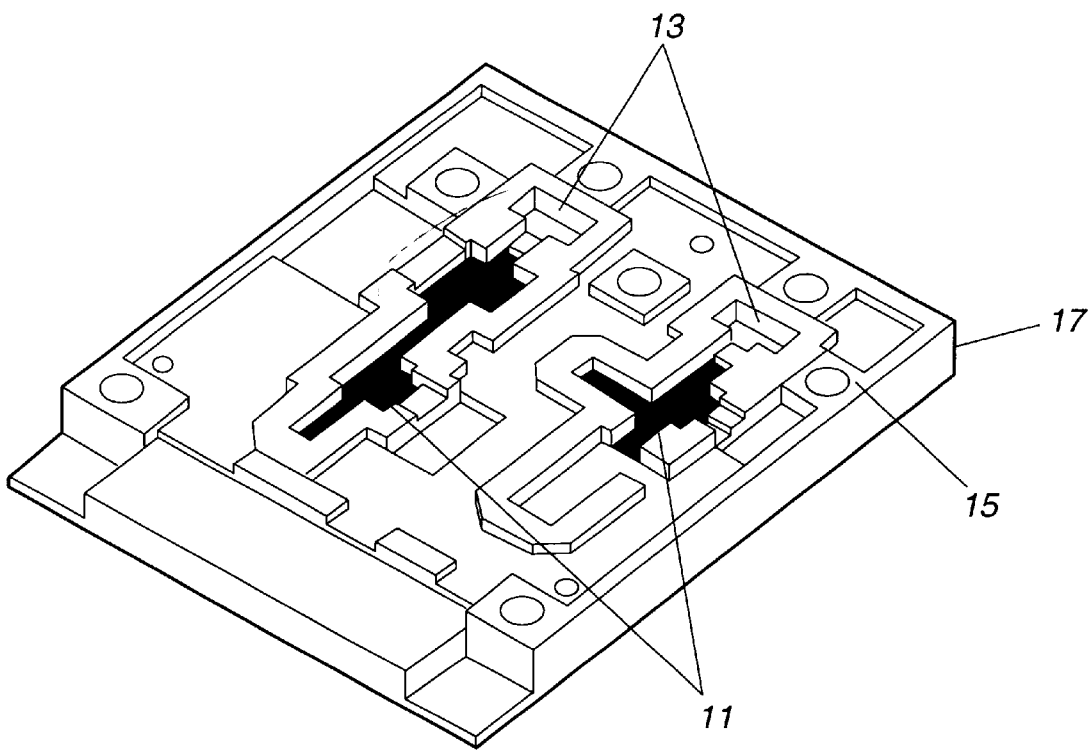
FIG. 1b is a top view illustration of the FIG. 1a prior art microwave package cover, with microwave absorbing material shown as the shaded areas.
Figure 2A:
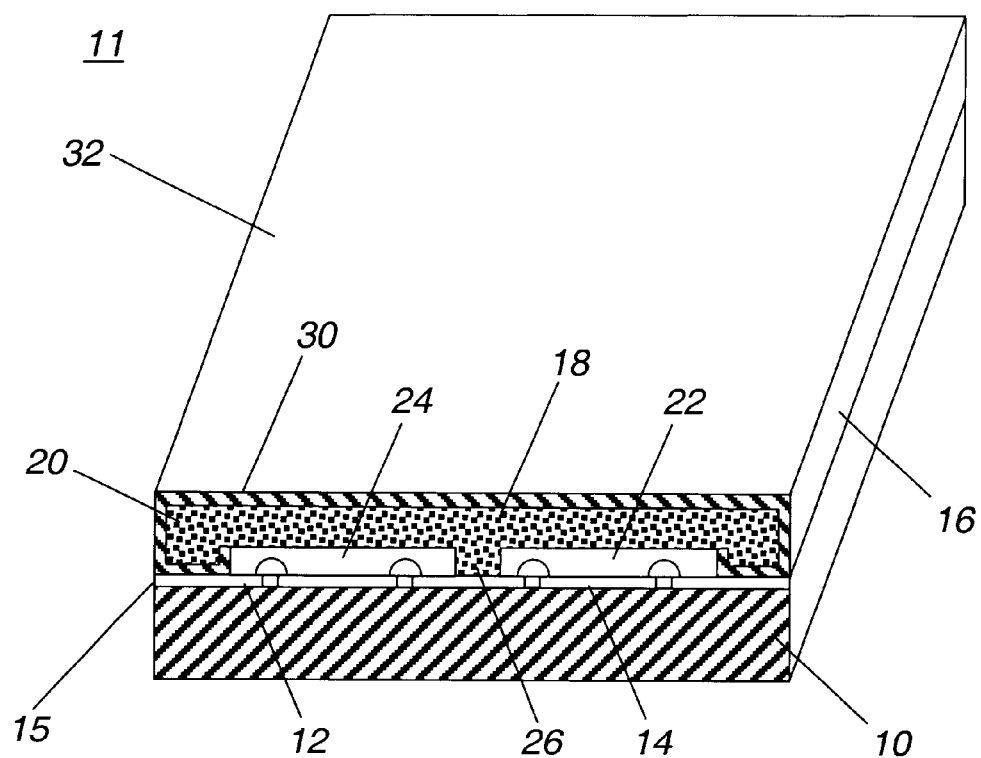
FIG. 2a is a cross section view illustration of a packaged electronic system having a channeled cover and a flat base in accordance with the present invention.
Figure 2B:
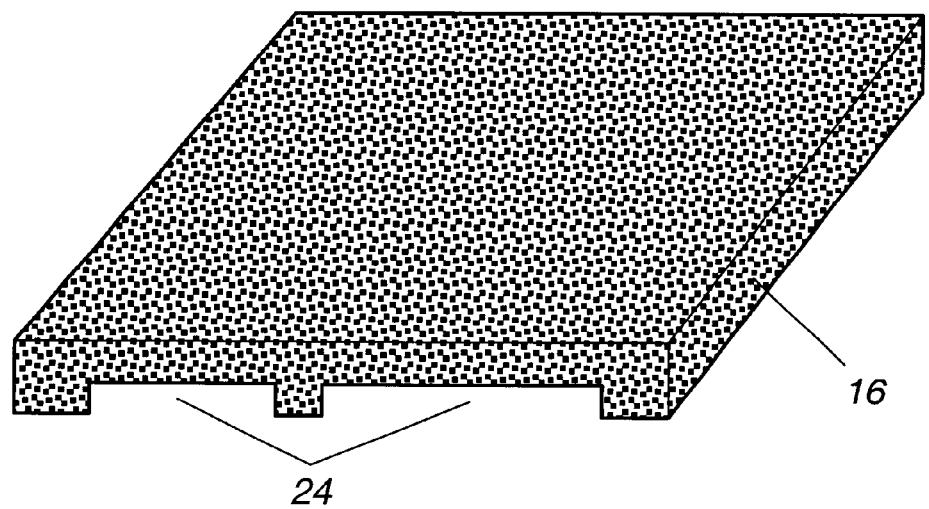
FIG. 2b, is a cross section view illustration of an alternate channeled microwave absorbing cover without selective plating in accordance with the present invention.
Figure 2C:
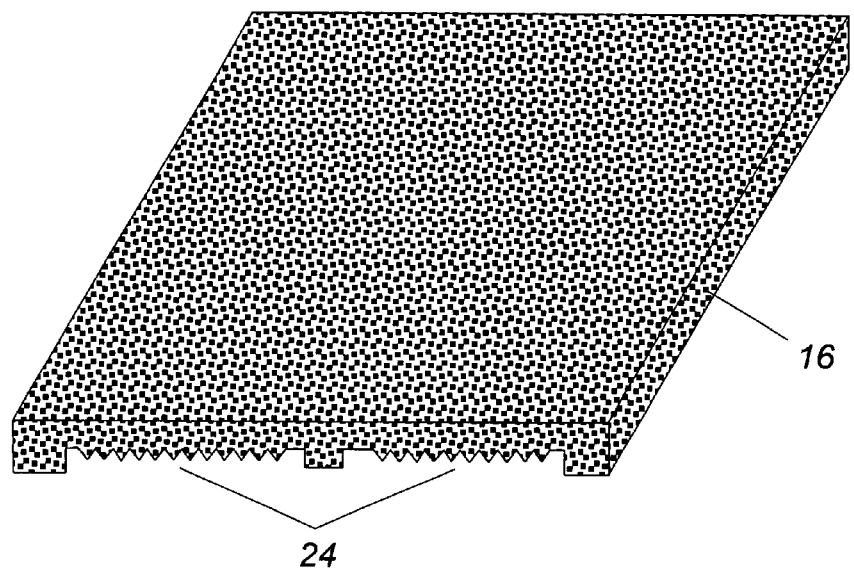
FIG. 2c, is a cross section view illustration of an alternate channeled microwave absorbing cover without selective plating and having corrugated ceilings in accordance with the present invention.

Traditionally, packages are built in two pieces—a cover, and a flat base or housing. Referring to FIG. 2a, a preferred embodiment of the present invention includes a packaged microwave system 11 having a flat base 10, where a plurality of discrete electronic components 14 and a plurality of interconnecting conductors 12 are attached to a surface 15 of the base 10. The packaged microwave system 11 also includes a cover 16 having a molded body 18 formed from an electromagnetic wave absorbing thermoplastic material 20, with the cover 16 attached to the assembled base 10. As illustrated in the preferred embodiment, the exterior of the cover 16 is selectively plated over the entire exterior surface 32 and over the interior surface 28 (see FIG. 2d) except in the ceilings 36 of the cavities 24 where microwave or RF absorption is required. The plating 30 is a metal material that provides grounding for components within the base 10, shields the circuits within the package from external RF interference, and provides electromagnetic interference (EMI) and radio frequency interference (RFI) shielding between adjacent cavities. Alternatively, as shown in FIGS. 2b and 2c, the plating may be eliminated in packaged systems where the electromagnetic wave-absorbing thermoplastic material forming the cover 16 is sufficient to keep electronic signals confined within the cavities 24 of the cover 16.

Figure 2D:
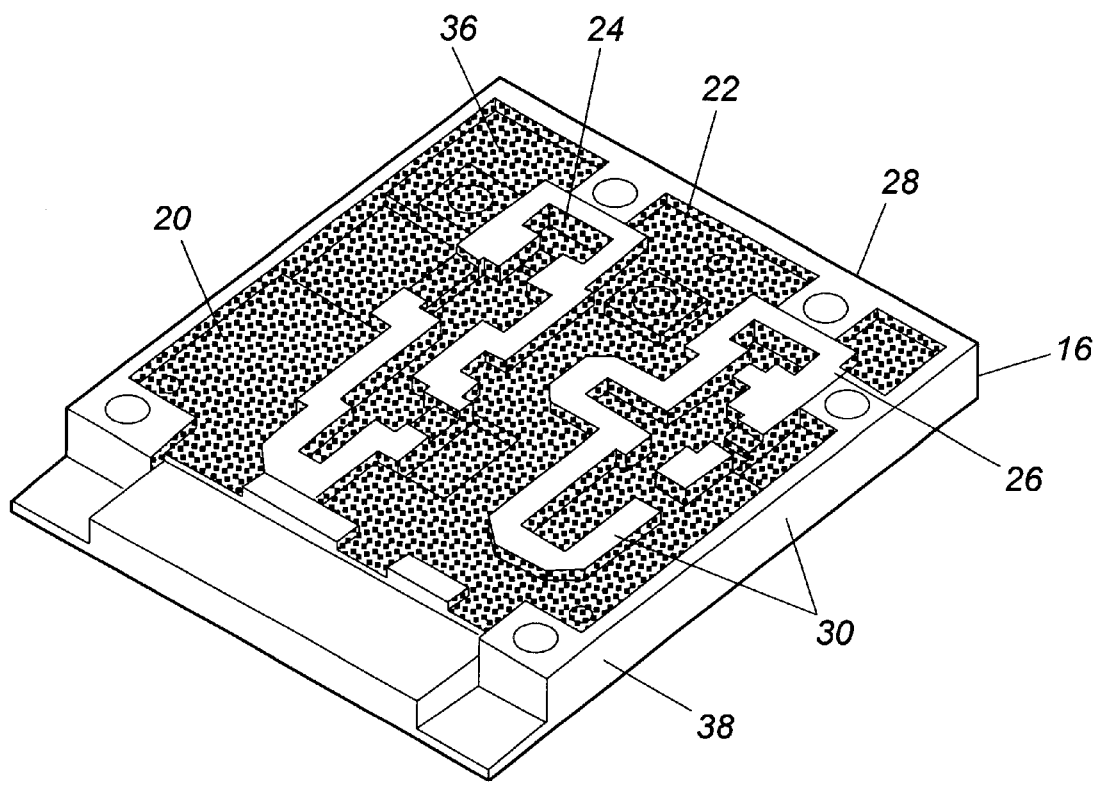
FIG. 2d is a top view illustration of the interior surface of the FIG. 2a package cover in accordance with the present invention.
Figure 2E:
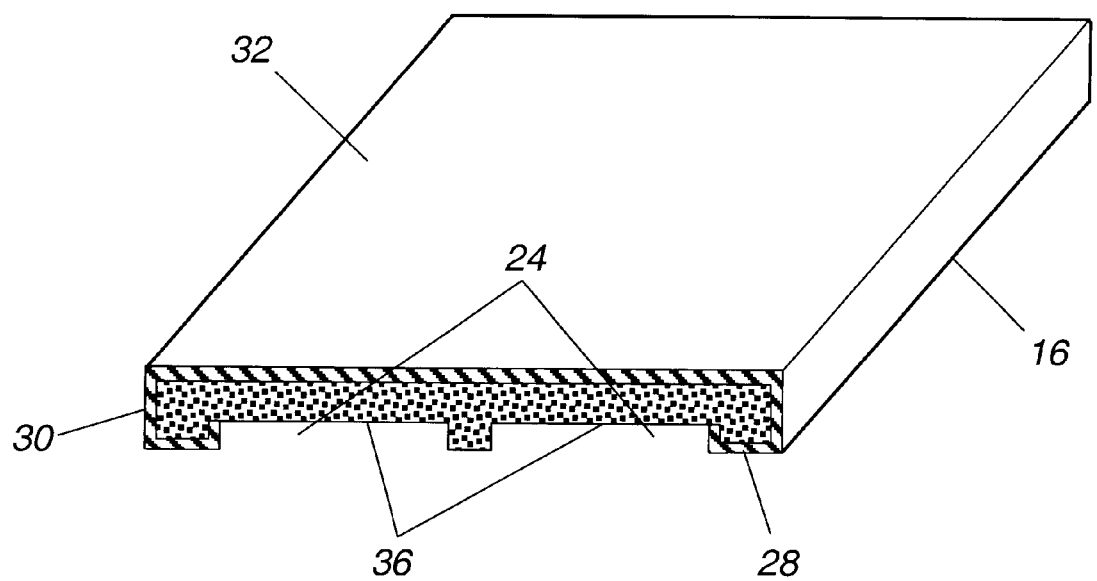
FIG. 2e, is a cross section view illustration of the FIG. 2a packaged system cover having a channeled and selectively plated microwave absorbing cover in accordance with the present invention.
Figure 2F:
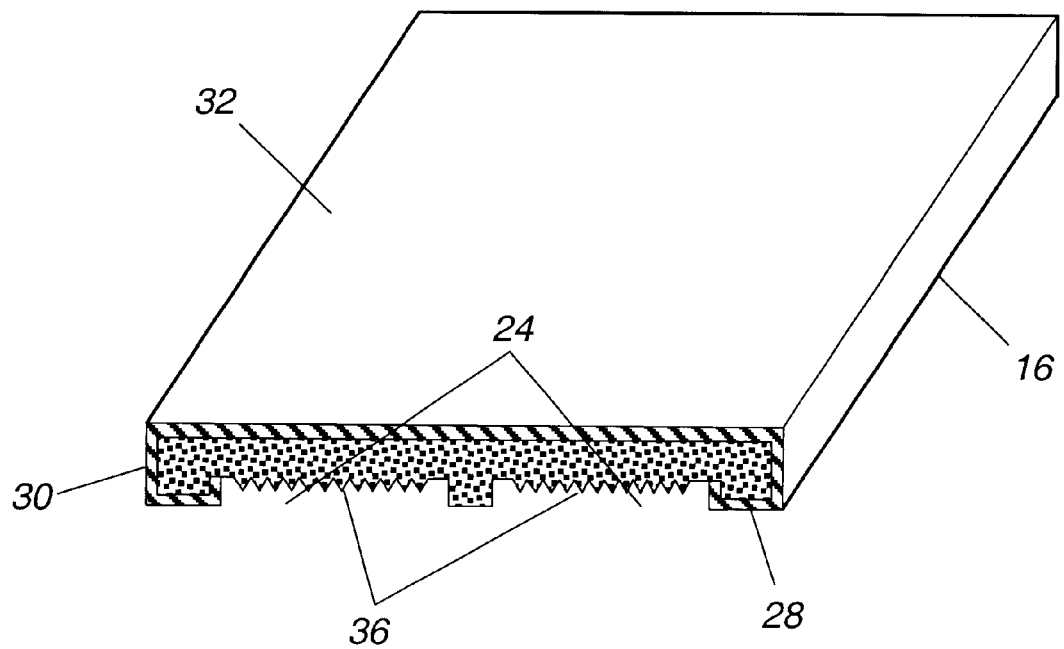
FIG. 2f, is a cross section view illustration of an alternate embodiment of the FIG. 2a packaged system cover having channeled and selectively plated microwave absorbing cover with corrugated ceilings in accordance with the present invention.

Referring to FIG. 2d, the interior surface 28 of the cover 16 may be formed of a plurality of channels 22, cavities 24, and walls 26 that confine the electronic fields of a particular electronic component. Molding the microwave cover 16 allows the entire cover to be shaped (including cavities 24, channels 22, and walls 26) and the microwave absorbing materials 20 installed all as part of a single molding process. As shown in FIG. 2e, the ceilings 36 of the cavities 24 may be flat, or contoured, as illustrated in FIG. 2f where the contoured ceilings 36 create variable dielectrics and further reduce electromagnetic resonance within the cavities 24.

Figure 3A:
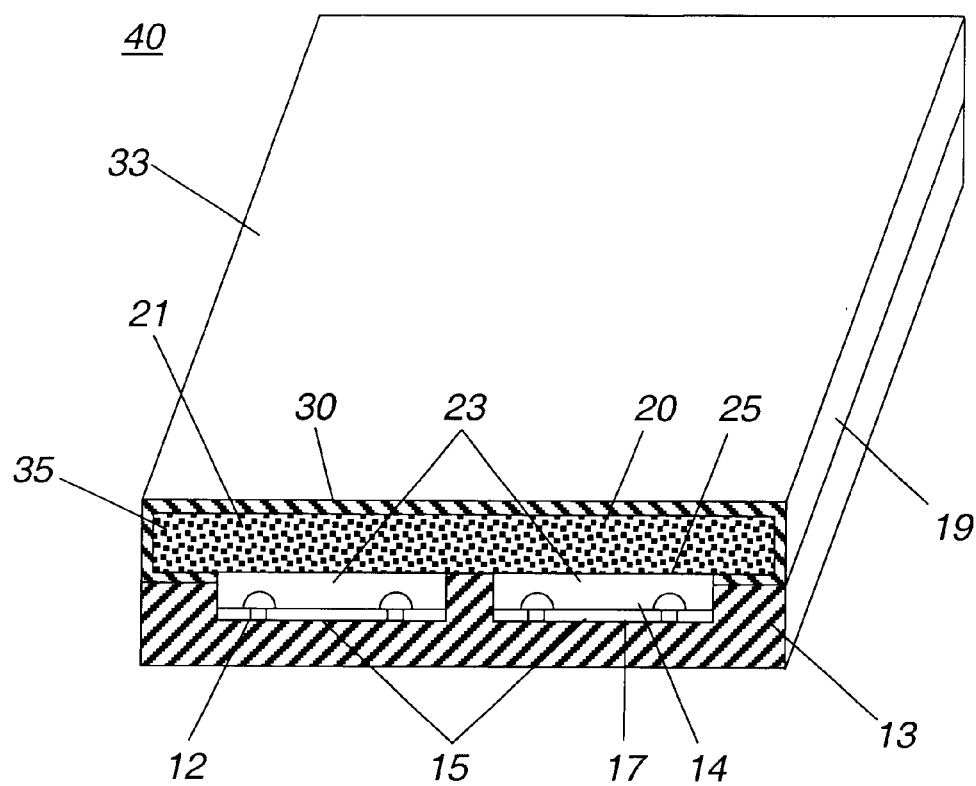
FIG. 3a is a cross section view illustration of an alternate packaged electronic system having a flat cover and a base containing channels in accordance with the present invention.
Figure 3B:
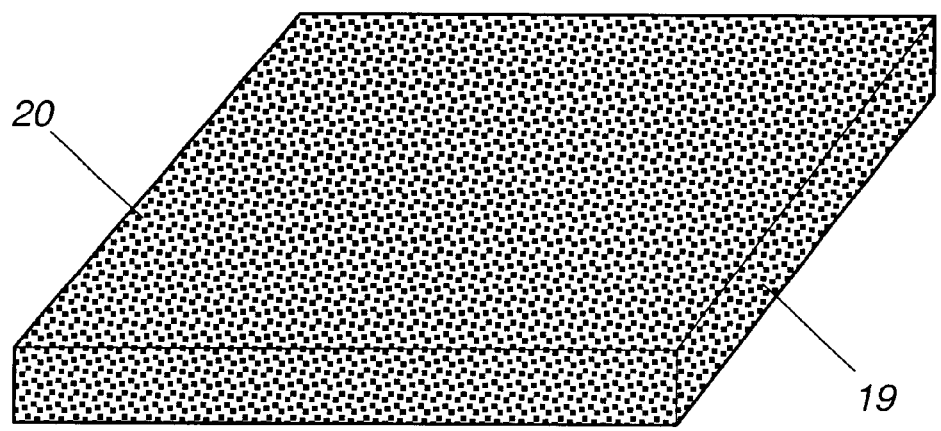
FIG. 3b, is a cross section view illustration of an alternate flat microwave absorbing cover without selective plating in accordance with the present invention.
Figure 3C:
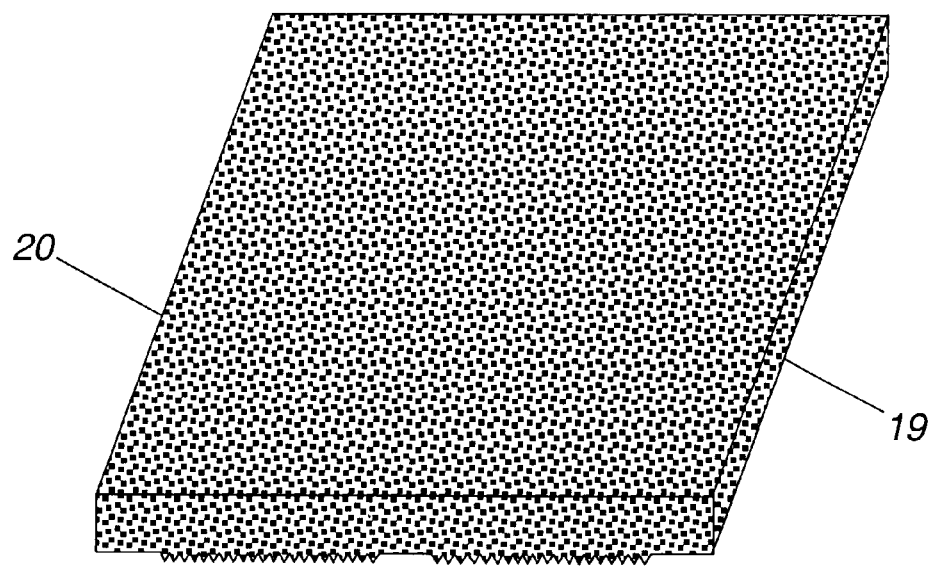
FIG. 3c, is a cross section view illustration of an alternate flat microwave absorbing cover without selective plating and having corrugated ceilings in accordance with the present invention.

Referring to FIG. 3a, an alternate embodiment of the present invention is illustrated where a packaged microwave system 40 includes a base 13 with housing depressions (cavities) 25 instead of the flat base 10 previously described in the packaged microwave system 11 and illustrated in FIG. 2a. Specifically, the packaged microwave system 40 includes the base 13 having housing cavities 23, where a plurality of discrete electronic components 14 and a plurality of interconnecting conductors 12 are attached within the housing cavities 23 to a surface 17 of the base 13. The packaged microwave system 40 includes a flat cover 19 having a molded body 21 formed from electromagnetic wave absorbing thermoplastic material 20. The cover 19 is attached to the surface 35 of the assembled base 13 forming cavities 23. The cover 19 is selectively plated 30 over the entire exterior surface 33 and over the interior surface 29 (see FIG. 3d) except in the areas that require microwave absorption, grounding and shielding properties. Alternatively, as shown in FIGS. 3b and 3c the plating 30 may be eliminated where the electromagnetic wave-absorbing thermoplastic material 20 that forms the cover 19 is sufficient to keep signals confined within the cavities 23 of the packaged system 40.

Figure 3D:
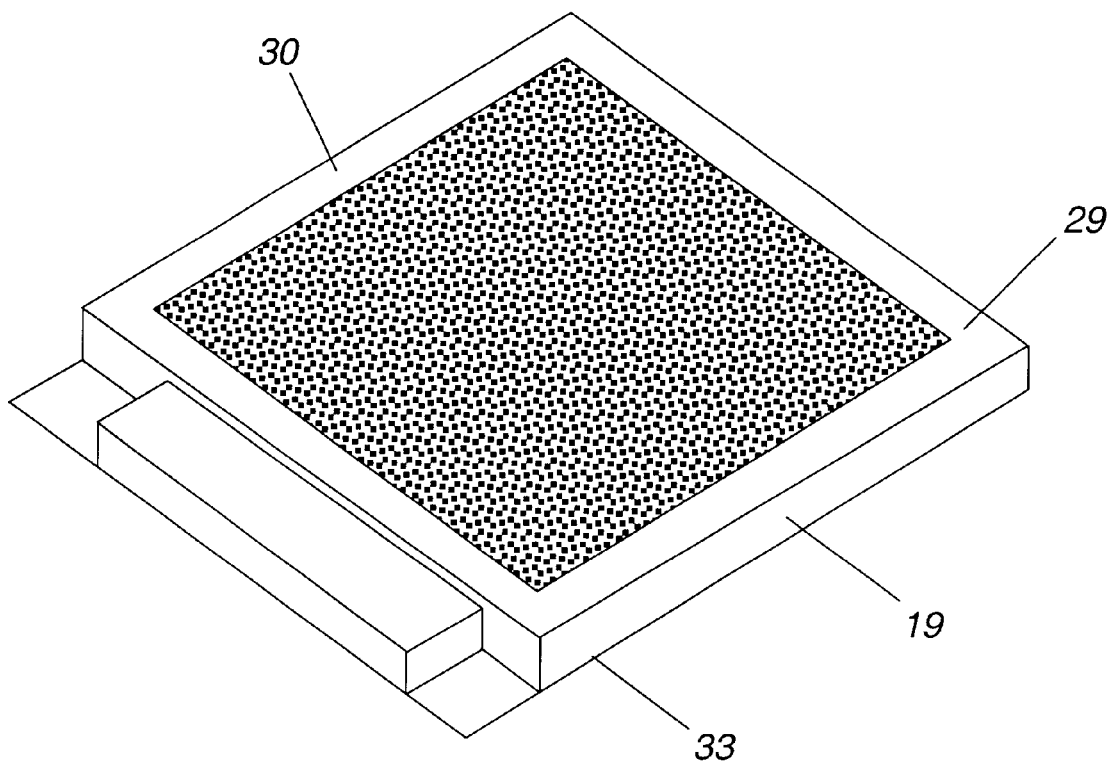
FIG. 3d is a top view illustration of the interior surface of the FIG. 3a package cover in accordance with the present invention.
Figure 3E:
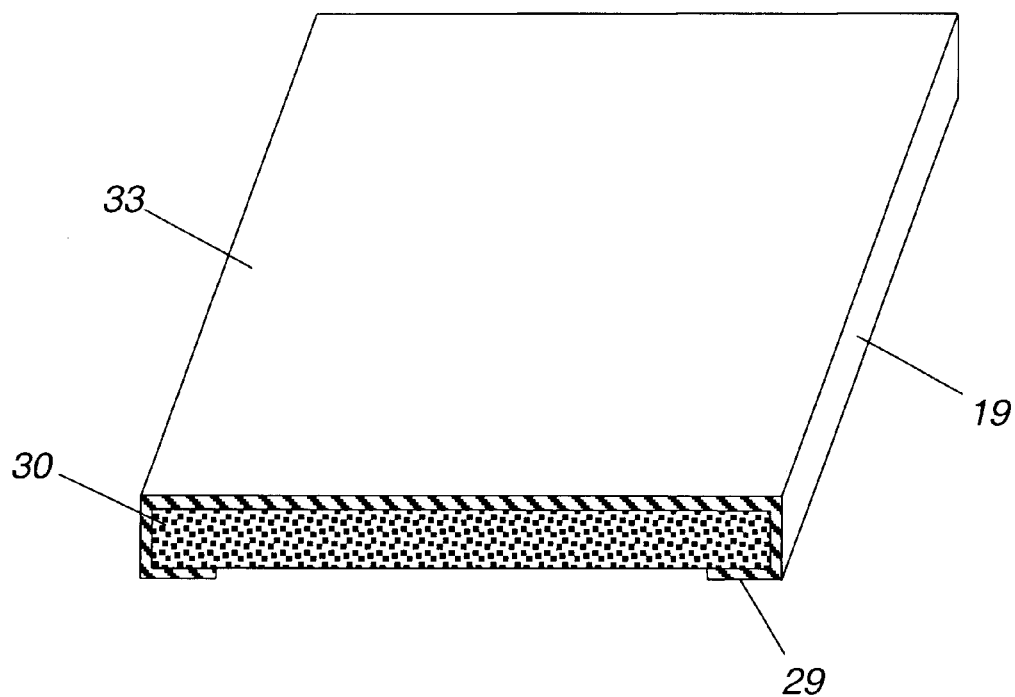
FIG. 3e is a cross section view illustration of the FIG. 3a packaged system cover having flat and selectively plated ceilings in accordance with the present invention.
Figure 3F:
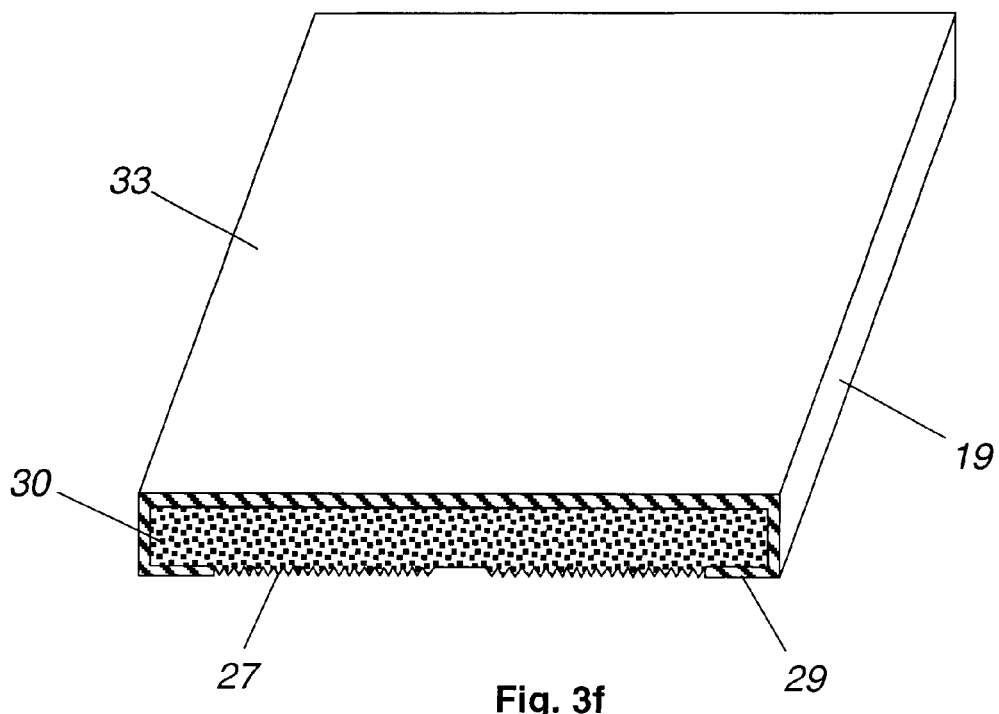
FIG. 3f is a cross section view illustration of an alternate embodiment of the FIG. 3a packaged system cover having corrugated ceilings in accordance with the present invention.

Referring to FIG. 3d, the interior surface 29 of the cover 19 is entirely flat, thereby creating flat ceilings 25 over the cavities 23 of the packaged system 40 illustrated in FIG. 3a. Alternatively, as shown in FIGS. 3e and 3f respectively, the interior surface 29 of the cover 19 may be flat or selectively contoured forming contoured ceilings 27 within the cavities 23. As previously mentioned, the contouring provides additional electromagnetic resonance dampening.

The covers (16, 19) of the previously described microwave packages (11, 40) are essential components of their respective packages. The covers (16, 19) provide isolation of electronic fields and signals contained within the packages (11, 40) and they also provide the microwave absorbing characteristics required for dampening any cavity (24, 23) electromagnetic resonance. For the purposes of the preferred embodiment, each cover body (18, 21) is a composite material 20 that includes a plastic material and an electromagnetic wave-absorbing material. The plastic material is chosen from the group of thermoplastics. Thermoplastics are preferred because they can be reflowed many times so scraps remaining after the molding process are reusable, and thermoplastics are injection moldable for fast cycle times and lower cost. Because plastics typically exhibit characteristics of coefficient of thermal expansion (CTE) and volume resistivity which are higher than their metal counterparts, it is important that a plastic is chosen which can accommodate loading (fillers) to meet the requirements of a particular packaged system. For example, the CTE value of thermoplastics can be lowered by adding fillers such as glass and carbon fibers and the volume resistivity can be lowered by adding conductive fillers such as stainless steel, nickel coated graphite, and polyacrylonitrile carbon fibers. Lowering the CTE and volume resistivity of the plastic cover allows the cover to have characteristics similar to the metal covers used in conventional microwave packages and have the RF absorbing properties that conventional metal covers do not have. The preferred thermoplastic material of the illustrated embodiment is 25% carbon fiber reinforced polyetherimide (PEI), however, it may also include 40% glass reinforced polyphenylenesulfide (PPS), acrylonitrile butadiene styrene (ABS), 9% carbon reinforced polyethylene terephthalate (PET), nylon, stainless steel filled carbon reinforced polyethersulfene (PES), or carbon filled stainless filled nylon.

The composite material 20 used to form the microwave package covers (16, 19) is further comprised of an electrically conductive and electromagnetic wave-absorbing material. The electromagnetic wave-absorbing material is chosen for its "lossy" effects and ability to absorb electromagnetic waves that may resonate and cause undesirable interference within an electronic package. The preferred electromagnetic wave absorbing material is ferrite, and is chosen for its high absorption threshold. Alternatively, the absorbing material may include stainless steel filled polycarbonate, stainless steel filled polyethersulfone, carbon fiber filled polycarbonate, ferrite filled liquid crystal polymer, or carbonyl iron filled liquid crystal polymer.

The exterior surfaces (32, 33) of the covers (16, 19) may be plated, as previously described, using a metal plating 30. The metal plating 30 is comprised of 40 μin electroless copper and 20 μin electroless nickel. Other plating materials may include copper, gold, conductive paints such as silver or similar materials suitable for plating.

Obviously, many modifications and variations of the present invention are possible in light of the above teachings. Thus, it is to be understood that, within the scope of the appended claims, the invention may be practiced otherwise than as specifically described above.

What is claimed is:

1. A packaged electronic system, comprising:
   a base having a surface;
   a plurality of discrete electronic components disposed on said surface;
   a cover disposed on said base surface and having a molded body, an exterior surface, and an interior surface, wherein said molded body being formed of a material exhibiting electromagnetic wave-absorbing characteristics;
   and wherein said molded body comprises a plurality of channels, a plurality of cavities, and a plurality of walls on said interior surface.

2. A packaged electronic system as recited in claim 1, wherein said molded body is formed of a composite material, said composite material comprising a plastic material and an electromagnetic wave-absorbing material.

3. A packaged electronic system as recited in claim 2, wherein said plastic material is a thermoplastic material.

4. A packaged electronic system as recited in claim 2, wherein said plastic material is selected from the group consisting of 40% glass reinforced polyphenylenesulfide (PPS), 25% carbon fiber reinforced polyetherimide (PEI), acrylonitrile butadiene styrene, 9% carbon reinforced polyethylene terephthalate (PET), nylon, stainless steel filled carbon reinforced polyethersulfene (PES), and carbon filled stainless filled nylon.

5. A packaged electronic system as recited in claim 2, wherein said electromagnetic wave-absorbing material is selected from the group consisting of ferrite, stainless steel filled polycarbonate, stainless steel filled polyethersulfone, carbon fiber filled polycarbonate, ferrite filled liquid crystal polymer, and carbonyl iron filled liquid crystal polymer.

6. A packaged electronic system, comprising:
   a base having a surface;
   a plurality of discrete electronic components disposed on said surface;
   a cover disposed on said base surface and having a molded body, an exterior surface, and an interior surface, wherein said molded body being formed of a material exhibiting electromagnetic wave-absorbing characteristics;
   and wherein said cover interior surface has an electrically conducting material selectively deposited thereon.

7. A packaged electronic system as recited in claim 6, wherein said electrically conducting material is selected from the group consisting of copper, nickel, tin, gold, and conductive paints.

* * * * *